United States Patent
Trnka et al.

(10) Patent No.: US 9,519,029 B2
(45) Date of Patent: Dec. 13, 2016

(54) MODEL-BASED BATTERY MONITORING

(71) Applicant: Honeywell International Inc., Morristown, NJ (US)

(72) Inventors: Pavel Trnka, Prague (CZ); Vladimir Havlena, Prague (CZ)

(73) Assignee: Honeywell International Inc., Morris Plains, NJ (US)

(*) Notice: Subject to any disclaimer, the term of this patent is extended or adjusted under 35 U.S.C. 154(b) by 777 days.

(21) Appl. No.: 13/907,196

(22) Filed: May 31, 2013

(65) Prior Publication Data
US 2014/0358459 A1 Dec. 4, 2014

(51) Int. Cl.
*G01R 31/36* (2006.01)

(52) U.S. Cl.
CPC ....... *G01R 31/3651* (2013.01); *G01R 31/3662* (2013.01); *G01R 31/3679* (2013.01)

(58) Field of Classification Search
CPC .................................................. G01R 31/3662
USPC ........................................................ 702/63
See application file for complete search history.

(56) References Cited

U.S. PATENT DOCUMENTS

| | | | | |
|---|---|---|---|---|
| 7,072,871 B1* | 7/2006 | Tinnemeyer | ....... | G01R 31/3651 320/132 |
| 8,548,762 B2* | 10/2013 | Prada et al. | ....... | G01R 31/3624 702/182 |
| 2013/0030768 A1 | 1/2013 | Havlena | | |
| 2015/0285869 A1* | 10/2015 | Wada | .................... | H01M 10/48 702/63 |

OTHER PUBLICATIONS

Plett, "Extended Kalman Filtering for Battery Management Systems of LiPB-based HEV Battery Packs Part 1. Background", Journal of Power Sources 134 (2004) 252-261, Received Jan. 27, 2004, Accepted Feb. 26, 2004 (10 pages).

* cited by examiner

*Primary Examiner* — Bryan Bui
(74) *Attorney, Agent, or Firm* — Brooks, Cameron & Huebsch, PLLC

(57) ABSTRACT

Methods, systems, and devices for monitoring a battery are described herein. One method includes receiving a plurality of values, each value associated with a respective battery characteristic, and determining an internal state associated with the battery based, at least in part, on the plurality of values.

17 Claims, 4 Drawing Sheets

MODEL-BASED BATTERY MONITORING

TECHNICAL FIELD

The present disclosure relates to methods, systems, and devices for monitoring a battery.

BACKGROUND

A battery (e.g., a lithium-ion battery) can have a number of internal state variables (e.g., internal state variable functions). A set of selected internal state variables can be denoted as an internal state. For example, an internal state can include remaining charge, state of health (e.g., capacity fade), remaining energy, and/or maximum peak power, among others. Various internal state variables of a battery can be determined (e.g., estimated) based on measured (e.g., sensed) values associated with the battery. For example, one or more internal state variables can be determined based on measured battery temperature, voltage and/or current (e.g., associated with terminals of the battery).

The determined internal state of a battery may be used in managing the battery. In a hybrid and/or electric vehicle, for instance, a determined internal state of a battery may be used in managing a power train of the vehicle.

Previous approaches to battery monitoring may encounter complications in high power applications, for instance, where slow battery internal electrochemical diffusion phenomena may play a significant role. Further, previous approaches may lack accuracy in some instances due to manufacturing variability of individual battery cell parameters. Accordingly, under previous approaches, batteries may be operated conservatively (e.g., in a reduced range of discharge depth) limiting battery usage potential.

DETAILED DESCRIPTION

Figure 1:
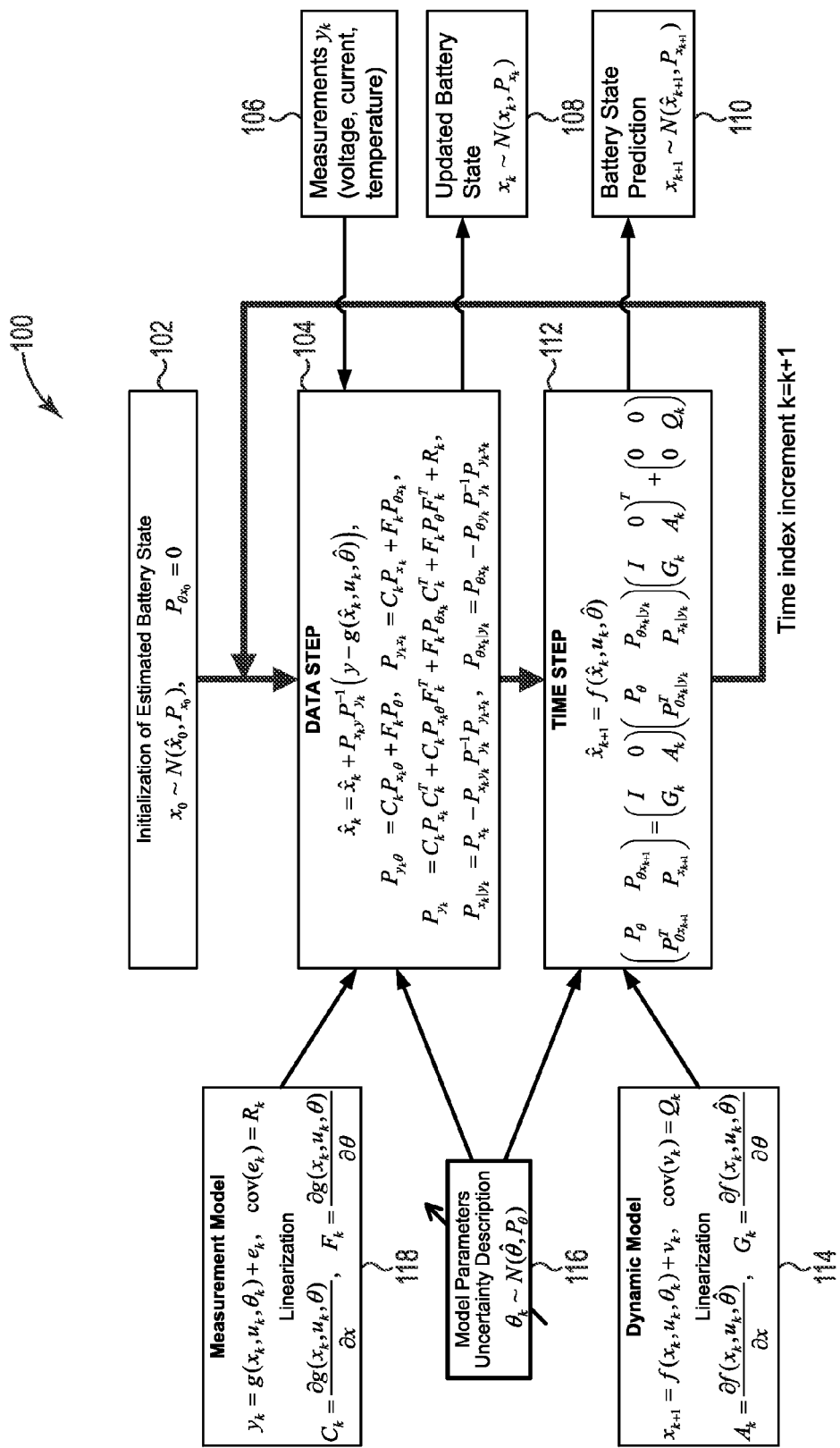
FIG. 1 is a block diagram illustrating a number of steps associated with monitoring a battery in accordance with one or more embodiments of the present disclosure.

Devices, methods, and systems for monitoring a battery are described herein. For example, one or more embodiments include receiving a plurality of values, each value associated with a respective battery characteristic, and determining an internal state associated with the battery based, at least in part, on the plurality of values.

Battery monitoring in accordance with one or more embodiments of the present disclosure can use an inferential sensor as a modification of a Kalman filter for models with uncertain parameters to determine (e.g., estimate) an internal state of a battery. For example, an internal state can include remaining charge, state of health (e.g., capacity fade), remaining energy, and/or maximum peak power, among others. Accordingly, embodiments of the present disclosure can allow various batteries to be monitored (e.g., used to their full potential) in high power applications where slow battery internal electrochemical diffusion phenomena play a significant role.

Additionally, embodiments of the present disclosure can be used to determine an internal state of a battery having a plurality of cells, wherein each of the plurality of cells includes a respective set of unique material properties. That is, embodiments of the present disclosure can be use to monitor batteries having manufacturing variability of individual battery cell parameters. Further, embodiments of the present disclosure can reduce (e.g., eliminate) the conservative operation of batteries (e.g., by vehicles), thereby increasing battery usage potential as compared to previous approaches.

"Vehicle" and/or "(H)EV" as referred to herein, can include vehicles having electric propulsion systems and/or various combinations of internal combustion engines and electric propulsion systems. Although various embodiments are described herein with respect to vehicle applications, the present disclosure is not limited to such applications. For example, one or more batteries can be monitored in aerospace applications, power grid balancing applications, etc.

A battery can be a device comprising one or more electrochemical cells that convert stored chemical energy into electrical energy (e.g., as in discharging) and/or convert electrical energy into stored chemical energy (e.g., as in recharging). Further "battery," as used herein, can refer to one or more electrochemical cells of a battery. For example, batteries can include one or more cells of lithium-ion batteries (e.g., lithium cobalt oxide, lithium iron phosphate, lithium manganese oxide, lithium nickel manganese cobalt oxide, lithium nickel cobalt aluminum oxide, and/or lithium titanate, etc.) among others.

In the following detailed description, reference is made to the accompanying drawings that form a part hereof. The drawings show by way of illustration how one or more embodiments of the disclosure may be practiced.

These embodiments are described in sufficient detail to enable those of ordinary skill in the art to practice one or more embodiments of this disclosure. It is to be understood that other embodiments may be utilized and that process changes may be made without departing from the scope of the present disclosure.

As will be appreciated, elements shown in the various embodiments herein can be added, exchanged, combined, and/or eliminated so as to provide a number of additional embodiments of the present disclosure. The proportion and the relative scale of the elements provided in the figures are intended to illustrate the embodiments of the present disclosure, and should not be taken in a limiting sense.

The figures herein follow a numbering convention in which the first digit or digits correspond to the drawing figure number and the remaining digits identify an element or component in the drawing. Similar elements or components between different figures may be identified by the use of similar digits.

As used herein, "a" or "a number of" something can refer to one or more such things. For example, "a number of steps" can refer to one or more steps.

FIG. 1 is a block diagram 100 illustrating a number of steps associated with monitoring a battery in accordance with one or more embodiments of the present disclosure. Block diagram 100 can represent a Kalman filter for models with uncertain parameters, for instance, such as the determination of one or more internal state variable(s) of a battery. As discussed further below, steps of block diagram 100 can be performed by a computing device executing computer-readable instructions, for instance, and/or a controller.

For example, a discrete state space model $$x_{k+1}=f(x_k,u_k,\theta_k)+v_k,$$

$$y_k=g(x_k,u_k,\theta_k)+e_k,$$

can be assumed, where $x \in \mathbb{R}^n$ is a state vector, $u \in \mathbb{R}^m$ is a vector of inputs, $y \in \mathbb{R}^l$ is a vector of outputs, $v \in \mathbb{R}^n$ and $e \in \mathbb{R}^l$ are zero-mean white noises with covariances cov(v)=Q, cov(e)=R. The function $f$ can represent model dynamics, as shown in block 114, and g can be a measurement function, as shown in block 118. Both functions can be parameterized by a vector of parameters $\theta \in \mathbb{R}^p$.

In Kalman filtering, there can be a number of basic approaches to handling of parameters. For example, parameters can be assumed to be constant and/or known $\theta_k = \theta_0$ (e.g., "constant parameters"). Alternatively or additionally, parameters can be described by their probability distribution (e.g., by their mean value and covariance) and updated by each new measurement (e.g., "estimated parameters"). Alternatively or additionally, parameters can be described by their probability distribution and not updated by each new measurement (e.g., "uncertain parameters").

In various embodiments, treating parameters as uncertain can improve Kalman filter robustness because, for example, estimating more than a particular number and/or ratio of parameters can yield inaccuracies (e.g., inaccuracies resembling overfitting). The following assumes that vector $\theta$ represents only uncertain parameters and that parameters for estimation are added to state vector x (e.g., as its extension).

Figure 2:
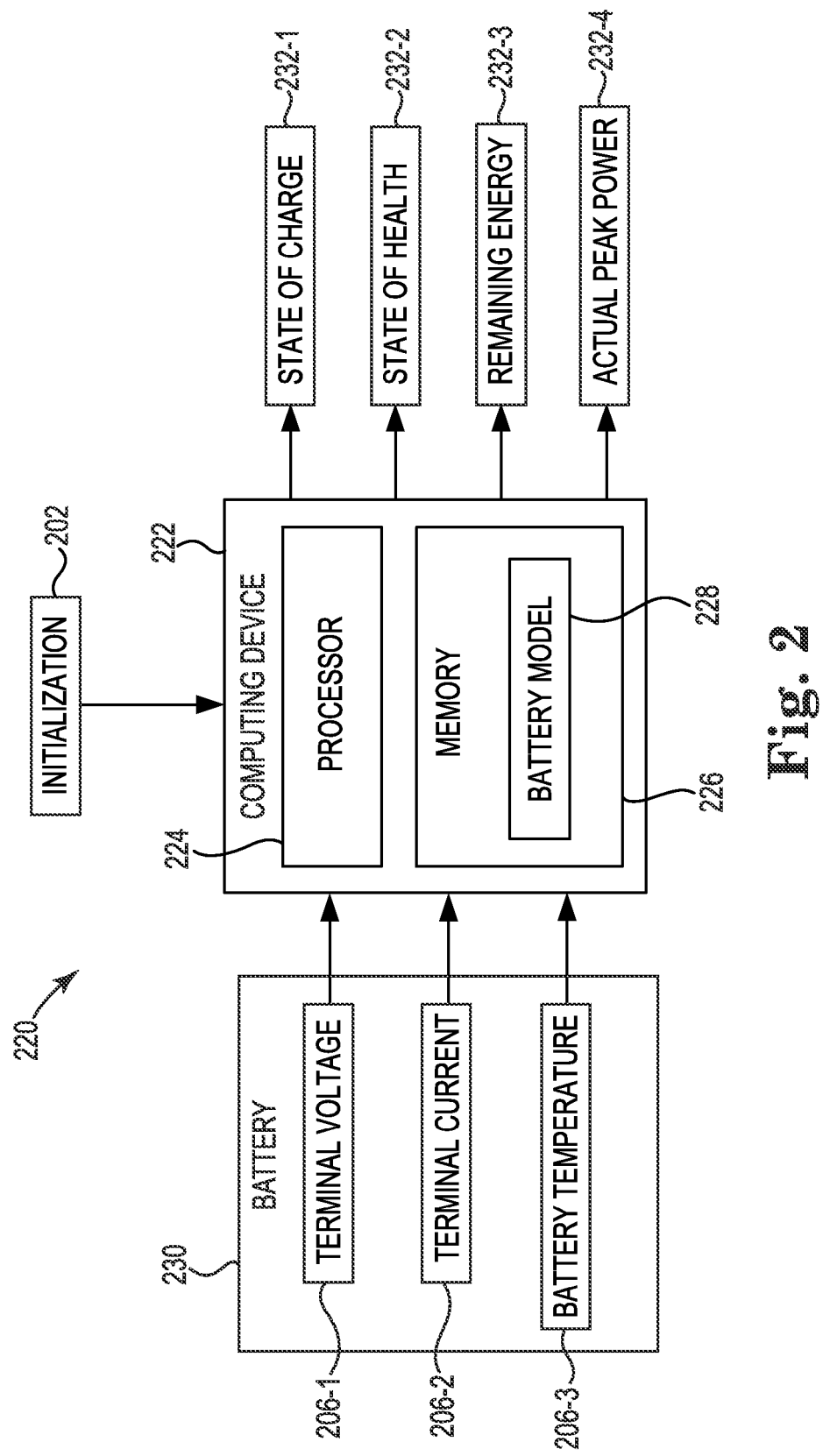
FIG. 2 illustrates a system for monitoring a battery in accordance with one or more embodiments of the present disclosure.

Estimated battery state can be initialized, and/or an initial internal state associated with the battery can be determined (e.g., when a battery monitor, such as computing device 222, discussed below in connection with FIG. 2, is connected to the battery) at an initialization step 102:

$$x_0 \sim N(\hat{x}_0, P_{x_0}), P_{\theta x_0}=0,$$

and in a data step 104, state estimate (updated battery state, as shown at block 108) at sampling period k incorporating data $\{\ldots, u_{k-1}, y_{k-1}\}$ can be assumed as:

$$x_k \sim N(\hat{x}_k, P_{x_k}).$$

It is noted that correct double indexing k|k−1 is not used in the embodiment discussed in connection with FIG. 1 to simplify notation. As shown in block 116, constant parameters uncertainty (e.g., without time indexing) can be described as:

$$\theta \sim N(\hat{\theta}, P_\theta).$$

The covariance of state and parameters:

$$\text{cov}(x_k, \theta) = P_{x_k\theta},$$

Can be (e.g., typically can be) initialized as zero. Measurement function g linearization $$y_k \approx g(\hat{x}_k, u_k, \hat{\theta}) + C_k \tilde{x}_k + F_k \tilde{\theta}_k + e_k,$$

Where $\tilde{x}_k$ and $\tilde{\theta}_k$ can be deviations from mean values and, as shown at block 118:

$$C_k = \frac{\partial g(x, u, \theta)}{\partial x}\bigg|_{x=\hat{x}_k, u=u_k, \theta=\hat{\theta}},$$

$$F_k = \frac{\partial g(x, u, \theta)}{\partial \theta}\bigg|_{x=\hat{x}_k, u=u_k, \theta=\hat{\theta}}.$$

Joint Covariance Matrix:

$$\text{cov}\begin{pmatrix} y_k \\ \theta \\ x_k \end{pmatrix} = \begin{pmatrix} P_{y_k} & P_{y_k\theta} & P_{y_k x_k} \\ P_{y_k\theta}^T & P_\theta & P_{\theta x_k} \\ P_{y_k x_k}^T & P_{\theta x_k}^T & P_{x_k} \end{pmatrix},$$

where new covariances related to measurement are:

$$P_{y_k\theta} = C_k P_{x_k\theta} + F_k P_\theta,$$

$$P_{y_k x_k} = C_k P_{x_k} + F_k P_{\theta x_k},$$

$$P_{y_k} = C_k P_{x_k} C_k^T + C_k P_{x_k\theta} F_k^T + F_k P_{\theta x_k} C_k^T + F_k P_\theta F_k^T + R_k.$$

State update can then be:

$$\hat{x}_k = \hat{x}_k + P_{x_k y_k} P_{y_k}^{-1}(y - g(\hat{x}_k, u_k, \hat{\theta})),$$

and updated covariances by the measurement(s) $y_k$ can be:

$$P_{x_k|y_k} = P_{x_k} - P_{x_k y_k} P_{y_k}^{-1} P_{y_k x_k},$$

$$P_{\theta x_k|y_k} = P_{\theta x_k} - P_{\theta y_k} P_{y_k}^{-1} P_{y_k x_k}.$$

As shown in block 106, and as discussed further below, values and/or measurement(s) $y_k$ can include voltage, current, and/or temperature, among other measurements. In various embodiments, covariance $P_\theta$ is not updated.

In a time step 112, time development of the state mean value (e.g., based on dynamic model 114 and model parameters uncertainty description 116) can be expressed as:

$$x_{k+1} = f(\hat{x}_k, u_k, \hat{\theta}).$$

Time development of the parameters and state covariances can be expressed as:

$$\begin{pmatrix} P_\theta & P_{\theta x_{k+1}} \\ P_{\theta x_{k+1}}^T & P_{x_{k+1}} \end{pmatrix} = \begin{pmatrix} I & 0 \\ G_k & A_k \end{pmatrix} \begin{pmatrix} P_\theta & P_{\theta x_k} \\ P_{\theta x_k}^T & P_{x_k} \end{pmatrix} \begin{pmatrix} I & 0 \\ G_k & A_k \end{pmatrix}^T + \begin{pmatrix} 0 & 0 \\ 0 & Q_k \end{pmatrix},$$

where partial derivatives, shown at block 114, can be enumerated as:

$$A_k = \frac{\partial f(x, u, \theta)}{\partial x}\bigg|_{x=\hat{x}_k, u=u_k, \theta=\hat{\theta}},$$

$$G_k = \frac{\partial f(x, u, \theta)}{\partial \theta}\bigg|_{x=\hat{x}_k, u=u_k, \theta=\hat{\theta}}.$$

As shown at block 110, an internal battery state prediction (e.g., time update) can be made for a time index increment of k=k+1 (e.g., a next internal battery state prediction), expressed as:

$$x_{k+1} \sim N(\hat{x}_{k+1}, P_{x_{k+1}})$$

As shown in FIG. 1, block diagram 100 can return to data step 104 upon a time index increment (e.g., k=k+1).

In other embodiments, determination of one or more internal state variables of a battery can be carried out using LDL factorization with simplified notation, such as:

$$LDL^T = [[L; d]],$$

for instance, where D is a diagonal matrix having positive values d on the diagonal, and where L is unit lower triangular-zero values above diagonal with ones on the diagonal:

$$L = \begin{pmatrix} 1 & & & \\ l_{1,2} & 1 & & \\ \vdots & & \ddots & \\ l_{n,1} & \cdots & l_{n,n-1} & 1 \end{pmatrix}.$$

In a data step, inputs can include measurement $y_k$ and input $u_k$; state mean value $\hat{x}_k$ and parameters mean value $\hat{\theta}$, and/or LD factors of parameter and state joint covariance matrix $L_\theta$, $L_{x_k|\theta}$, $\overline{L}_{x_k|\theta}$, $d_\theta$, $d_{x_k|\theta}$:

$$\begin{pmatrix} P_\theta & P_{\theta x_k} \\ P_{x_k \theta} & P_{x_k} \end{pmatrix} = \left[\left[ \begin{pmatrix} L_\theta & \\ K_{x_k|\theta} & L_{x_k|\theta} \end{pmatrix} ; \begin{pmatrix} d_\theta \\ d_{x_k|\theta} \end{pmatrix} \right]\right].$$

Data step inputs can additionally include LD factors of measurement noise covariance $L_{e_k}$, $d_{e_k}$:

$$R_k = [[L_{e_k}; d_{e_k}]].$$

Further, data step inputs can include linearization coefficients of measurement equation $C_k$, $F_k$:

$$C_k = \frac{\partial g(x, u, \theta)}{\partial x}\bigg|_{x=\hat{x}_k, u=u_k, \theta=\hat{\theta}},$$

$$F_k = \frac{\partial g(x, u, \theta)}{\partial \theta}\bigg|_{x=\hat{x}_k, u=u_k, \theta=\hat{\theta}}.$$

Once data step inputs are received, embodiments of the present disclosure can assemble:

$$[[L; D]] = \left[\left[ \begin{pmatrix} F_k L_\theta + C_k K_{x_k|\theta} & C_k L_{x_k|\theta} & L_{e_k} \\ L_\theta & 0_{p \times n} & 0_{p \times l} \\ K_{x_k|\theta} & L_{x_k|\theta} & 0_{n \times l} \end{pmatrix} ; \begin{pmatrix} d_\theta \\ d_{x_k|\theta} \\ d_{e_k} \end{pmatrix} \right]\right].$$

Note that L is not unit lower triangular. Embodiments can triangularize [[L;D]] by dyadic reduction $$\left[\left[ \begin{pmatrix} L_{y_k} & & \\ \hline K_{\theta|y_k} & L_{\theta|y_k} & \\ K_{x_k|y_k} & K_{x_k|y_k\theta} & L_{x_k|y_k\theta} \end{pmatrix} ; \begin{pmatrix} d_{y_k} \\ d_{\theta|y_k} \\ d_{x_k|y_k\theta} \end{pmatrix} \right]\right].$$

Embodiments can solve by back-substitution for q:

$$L_{y_k} q = y_k - g(\hat{x}_k, u_k, \hat{\theta}),$$

and determine state mean value update as:

$$\hat{x}_k = \hat{x}_k + K_{x_k|y_k} q.$$

Embodiments can assemble:

$$[[L; D]] = \left[\left[ \begin{pmatrix} K_{\theta|y_k} & L_{\theta|y_k} & 0_{p \times l} \\ 0 & K_{x_k|y_k\theta} & L_{x_k|y_k\theta} \end{pmatrix} ; \begin{pmatrix} d_{y_k} \\ d_{\theta|y_k} \\ d_{x_k|y_k\theta} \end{pmatrix} \right]\right].$$

Triangularization of [[L;D]] by dyadic reduction can yield final LD factors for the data step and parameters covariance recovery:

$$\text{cov}\begin{pmatrix} \theta \\ x_k \end{pmatrix} \bigg| y_k = \left[\left[ \begin{pmatrix} L_\theta & \\ \overline{K}_{x_k|y_k\theta} & \overline{L}_{x_k|y_k\theta} \end{pmatrix} ; \begin{pmatrix} d_\theta \\ \overline{d}_{x_k|y_k\theta} \end{pmatrix} \right]\right].$$

Accordingly, outputs of the data step can include updated state mean value $\hat{x}_k$ and/or LD factors of parameter and state joint covariance matrix $K_{x_k|\theta}$, $L_{x_k|y_k\theta}$, $d_{x_k|y_k\theta}$:

$$\begin{pmatrix} P_\theta & P_{\theta x_k} \\ P_{x_k\theta} & P_{x_k} \end{pmatrix} = \left[\left[ \begin{pmatrix} L_\theta & \\ \overline{K}_{x_k|y_k\theta} & \overline{L}_{x_k|y_k\theta} \end{pmatrix} ; \begin{pmatrix} d_\theta \\ \overline{d}_{x_k|y_k\theta} \end{pmatrix} \right]\right].$$

LD factors $L_\theta$, $d_\theta$ resulting from triangularization can be ignored as they may be perturbed by numeric errors, for instance.

In a time step, inputs can include state mean value $\hat{x}_k$, parameters mean value $\hat{\theta}$, input value $u_k$, and/or LD factors of parameter and state joint covariance matrix $L_\theta$, $K_{x_k|\theta}$, $L_{x_k|\theta}$, $d_\theta$, $d_{x_k|\theta}$:

$$\begin{pmatrix} P_\theta & P_{\theta x_k} \\ P_{x_k\theta} & P_{x_k} \end{pmatrix} = \left[\left[ \begin{pmatrix} L_\theta & \\ K_{x_k|\theta} & L_{x_k|\theta} \end{pmatrix} ; \begin{pmatrix} d_\theta \\ d_{x_k|\theta} \end{pmatrix} \right]\right].$$

Additionally, time step inputs can include LD factors of process noise covariance $L_{v_k}$, $d_{v_k}$:

$$Q_k = [[L_{v_k}; d_{v_k}]].$$

Further, time step inputs can include linearization coefficients of state equation $A_k$, $G_k$:

$$A_k = \frac{\partial f(x, u, \theta)}{\partial x}\bigg|_{x=\hat{x}_k, u=u_k, \theta=\hat{\theta}_k},$$

$$G_k = \frac{\partial f(x, u, \theta)}{\partial x}\bigg|_{x=\hat{x}_k, u=u_k, \theta=\hat{\theta}_k}.$$

Once time step inputs are received, mean value time step can be expressed as:

$$\hat{x}_{k+1} = f(\hat{x}_k, u_k, \hat{\theta}).$$

Embodiments of the present disclosure can assemble:

$$[[L; D]] = \left[\left[ \begin{pmatrix} L_\theta & 0_{p \times n} & 0_{p \times n} \\ G_k L_\theta + A_k K_{x_k|\theta} & A_k L_{x_k|\theta} & L_{v_k} \end{pmatrix} ; \begin{pmatrix} d_\theta \\ d_{x_k|\theta} \\ d_{v_k} \end{pmatrix} \right]\right].$$

Note that L is not unit lower triangular. Triangularization of [[L; D]] by dyadic reduction can yield LD factors of parameter and state joint covariance matrix after time step:

$$\left[\left[ \begin{pmatrix} L_\theta & \\ K_{x_{k+1}|\theta} & L_{x_{k+1}|\theta} \end{pmatrix} ; \begin{pmatrix} d_\theta \\ d_{x_{k+1}|\theta} \end{pmatrix} \right]\right].$$

Time step outputs can include new state mean value $\hat{x}_{k+1}$ and/or LD factors of parameter and state joint covariance matrix $K_{x_{k+1}|\theta}$, $L_{x_{k+1}|\theta}$, $d_{x_{k+1}|\theta}$:

$$\begin{pmatrix} P_\theta & P_{\theta x_{k+1}} \\ P_{x_{k+1}\theta} & P_{x_{k+1}} \end{pmatrix} = \left[ \begin{pmatrix} L_\theta & \\ K_{x_{k+1}|\theta} & L_{x_{k+1}|\theta} \end{pmatrix} ; \begin{pmatrix} d_\theta \\ d_{x_{k+1}|\theta} \end{pmatrix} \right].$$

LD factors $L_\theta, d_\theta$ resulting from triangularization can be ignored as they may be perturbed by numeric errors, for instance.

FIG. 2 illustrates a system 220 for monitoring a battery 230 in accordance with one or more embodiments of the present disclosure. As shown in FIG. 2, system 220 includes a computing device 222 communicatively coupled (e.g., connected) to a battery 230. A communicative coupling can allow information to be communicated in either direction between computing device 222 and battery 230. Computing device 222 can be, for example, a computer associated with a vehicle (e.g., engine control unit (ECU)), laptop computer, a desktop computer, or a mobile device (e.g., a mobile phone, a personal digital assistant, etc.), among other types of computing devices.

As shown in FIG. 2, computing device 222 includes a memory 226 and a processor 224 coupled to memory 226. Memory 226 can be any type of storage medium that can be accessed by processor 224 to perform various examples of the present disclosure. For example, memory 226 can be a non-transitory computer readable medium having computer readable instructions (e.g., computer program instructions) stored thereon that are executable by processor 224 to monitor a battery in accordance with one or more embodiments of the present disclosure.

Memory 226 can be volatile or nonvolatile memory. Memory 226 can also be removable (e.g., portable) memory, or non-removable (e.g., internal) memory. For example, memory 226 can be random access memory (RAM) (e.g., dynamic random access memory (DRAM) and/or phase change random access memory (PCRAM)), read-only memory (ROM) (e.g., electrically erasable programmable read-only memory (EEPROM) and/or compact-disc read-only memory (CD-ROM)), flash memory, a laser disc, a digital versatile disc (DVD) or other optical disk storage, and/or a magnetic medium such as magnetic cassettes, tapes, or disks, among other types of memory.

Further, although memory 226 is illustrated as being located in computing device 222, embodiments of the present disclosure are not so limited. For example, memory 226 can also be located internal to another computing resource (e.g., enabling computer readable instructions to be downloaded over the Internet or another wired or wireless connection).

Although not illustrated in FIG. 2, system 220 can include one or more controllers (e.g., one or more controllers instead of computing device 222 and/or portions of computing device 222). A controller can include logic. As used herein, "logic" is an alternative or additional processing resource to execute the actions and/or functions, etc., described herein, which includes hardware (e.g., various forms of transistor logic, application specific integrated circuits (ASICs), etc.), as opposed to computer executable instructions (e.g., software, firmware, etc.) stored in memory and executable by a processor.

As used below, "computing device 222" can refer to a computing device, such as computing device 222, and/or a controller having logic to execute the actions and/or functions, etc., described herein. Computing device 222 can be and/or be a portion of a controller (e.g., a microcontroller) associated with a battery monitoring and/or management system, such as one found in an (H)EV, for example.

Computing device 222 can be and/or be a portion of a controller associated with an (H)EV power train, for example, though embodiments of the present disclosure are not so limited.

Additional components can be included (but are not shown in FIG. 2 for purposes of clarity) in system 220. For example, such components can include various sensors configured to determine (e.g., measure, sense, and/or acquire) values of various characteristics associated with battery 230, among other components. Characteristics associated with battery 230 can include, for example, terminal voltage 206-1, terminal current 206-2, and/or battery temperature 206-3 (sometimes generally referred to as "characteristics 206"). Values associated with additional characteristics (not shown) can be determined, such as ambient temperature, for instance, among others.

Computing device 222 (e.g., memory 226) can include a battery model 228 (discussed further below in connection with FIG. 3). Battery model 228 can be used by computing device 222 to determine a relationship between received values (e.g., values associated with characteristics 206) and various internal state variables associated with battery 230. Such internal state variables can include state of charge 232-1, state of health 232-2, remaining energy 232-3, and/or actual peak power 232-4 (sometimes generally referred to herein as "internal state variables 232").

Computing device 222 can receive a plurality of values and/or measurements, each associated with a respective one of the characteristics 206. Following an initialization 202 (e.g., an initialization analogous to initialization step 102, previously discussed in connection with FIG. 1), computing device 222 can determine one or more of the internal state variables 232 based on battery model 228, for instance.

Figure 3:
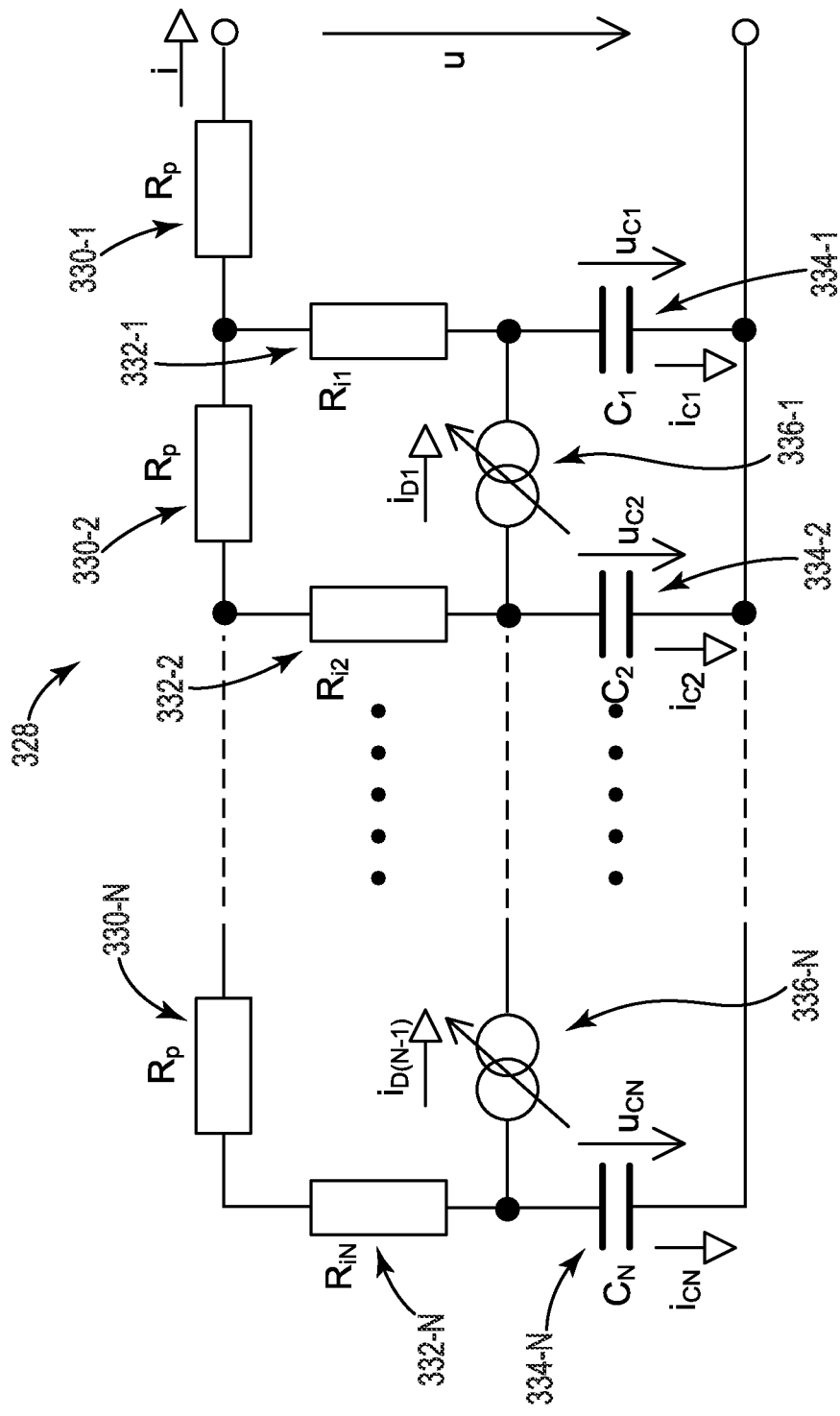
FIG. 3 illustrates a battery model in accordance with one or more embodiments of the present disclosure.

FIG. 3 illustrates a battery model 328 in accordance with one or more embodiments of the present disclosure. Battery model 328 is illustrated in FIG. 3 as an equivalent circuit having passive and active non-linear components composed from N parallel sub-circuits. In various embodiments of the present disclosure, such a model is used to represent (e.g., model) a battery (e.g., a lithium-ion battery) as it can capture distributed phenomena occurring under high current load due to slow dynamics of diffusion and/or electrochemical processes, for instance.

As shown in FIG. 3, battery model 328 includes a plurality of components (e.g., model components). Components of battery 328 include a first plurality of resistors (e.g., resistor 330-1, resistor 330-2, resistor 330-N) and a second plurality of resistors (e.g., resistor 332-1, resistor 332-2, resistor 332-N). Resistors 330-1, 330-2, 330-N, 332-1, 332-2, 332-N can be various types of resistors and embodiments of the present disclosure do not limit such types. As shown in FIG. 3, battery model 328 components include a plurality of capacitors (e.g., capacitor 334-1, capacitor 334-2, capacitor 334-N). Similarly, embodiments of the present disclosure do not limit any of capacitors 334-1, 334-2, 334-N to particular types.

Also illustrated in FIG. 3, battery model 328 components include a plurality of current sources (e.g., variable current sources): current source 336-1, current source 336-N. Embodiments of the present disclosure are not limited to particular types of current sources.

In an embodiment, parameters of the components illustrated in battery model 328 can be dependent on one or more internal state variables of battery model 328 (e.g., state of charge (SOC) (sometimes referred to as relative state of charge (RSOC)), state of health (SOH), and/or battery temperature (T)). Parameterization of components of battery model 328 can include:

$$R_i = R_{i0}(1 + \alpha_{RSOC}(1 - q_i/q_{MAX}) + \alpha_{RSOH}(1 - SOH) - \alpha_{RT}(T - T_0)),$$

$$R_p = R_{p0},$$

$$u_{Ci} = U_0 - \frac{K_1}{K_2 + \bar{q}_i} + A\exp(B\bar{q}_i),$$

$$\bar{q}_i = q_i(1 + \alpha_{USOH}(1 - SOH)),$$

$$i_{Di} = k_{dif}(q_{i+1} - q_i),$$

and model dynamics can include:

$$\dot{q}_i = i_{Ci},$$

$$S\dot{O}H = -\alpha_{SOHi}(1 + \alpha_{SOHT}(T - T_0))|i|,$$

$$\dot{Q} = \frac{1}{T_Q}(Q_R - Q),$$

$$\dot{T} = \frac{1}{T_{COOL}}(T_{AMB} - T) + \frac{1}{C_T}Q.$$

In such an embodiment, $q_i$ can be charge in capacitor i, $SOH \in \langle 0,1 \rangle$ can be global state of battery health, $Q_R$ can be released heat, Q can be delayed heat, and T can be battery temperature. Currents to capacitors $i_{Ci}$ can be determined based on one or more known circuit equations associated with battery model 328, for instance. Parameters:

$$R_{i0}, \alpha_{RSOC}, q_{MAX}, \alpha_{RSOH}, \alpha_{RT}, T_0, R_{p0}, U_0, K_1, K_2, A, B, \alpha_{USOH}, k_{dif}$$

can be determined based on experimental testing of the battery (e.g., battery 230), for instance.

Accordingly, with reference to FIG. 2, computing device 222 can receive one or more values (e.g., sensed values), each associated with a respective characteristic of battery 230 (e.g., terminal voltage 206-1, terminal current 206-2, and/or battery temperature 206-3). Computing device 222 can, in a manner discussed in connection with FIG. 1, determine one or more internal state variables 232 of battery 230 based on the received values and the model dynamics associated with battery model 328:

$$\dot{q}_i = i_{Ci},$$

$$S\dot{O}H = -\alpha_{SOHi}(1 + \alpha_{SOHT}(T - T_0))|i|,$$

$$\dot{Q} = \frac{1}{T_Q}(Q_R - Q),$$

$$\dot{T} = \frac{1}{T_{COOL}}(T_{AMB} - T) + \frac{1}{C_T}Q.$$

As previously discussed, determined internal state variable(s) 232 can include, for example, state of charge, (e.g., remaining charge) 232-1, state of health 232-2, remaining energy 232-3, and/or actual peak power 232-4, among others.

Figure 4:
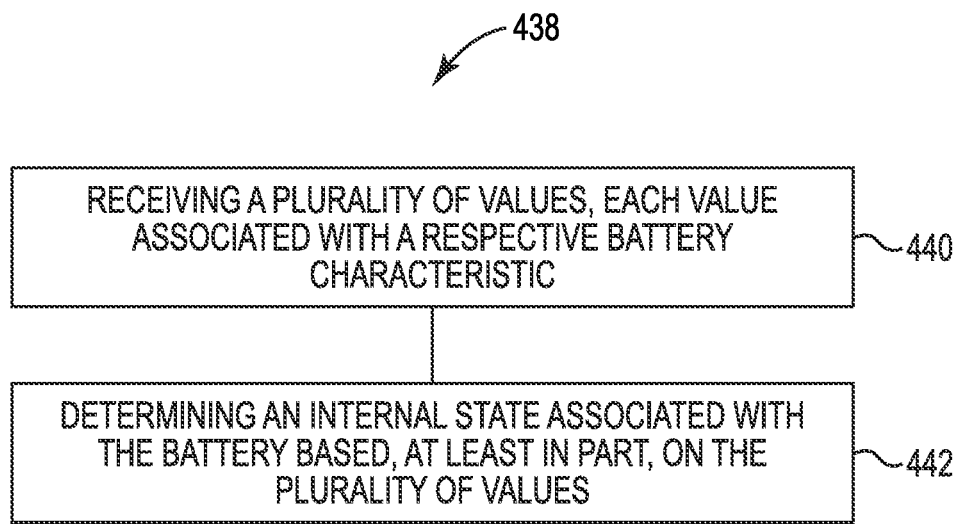
FIG. 4 illustrates a method for monitoring a battery in accordance with one or more embodiments of the present disclosure.

FIG. 4 illustrates a method 438 for monitoring a battery in accordance with one or more embodiments of the present disclosure. Method 438 can be performed, for example, by a computing device, such as computing device 332 previously described herein (e.g., in connection with FIG. 3) and/or by a controller, such as controller 224 previously described herein (e.g., in connection with FIG. 2).

At block 440, method 438 includes receiving a plurality of values, each value associated with a respective battery characteristic. Values can be sensed values, for instance, received from one or more sensors associated with the battery. Characteristics can include, for example, voltage, current, and/or temperature associated with the battery.

At block 442, method 438 includes determining an internal state associated with the battery based, at least in part, on the plurality of values. An internal state can be determined by using a Kalman filter for models with uncertain parameters in a manner analogous to that discussed in connection with FIGS. 1 and/or 2, for example. As previously discussed, the internal state can include state of health, state of charge, (e.g., remaining charge) remaining energy, and/or peak power, among others.

Although not illustrated in FIG. 4, method 438 can include taking one or more actions (e.g., one or more actions caused by controller 224 and/or computing device 332, previously discussed) responsive to the determination of one or more internal state variables. Method 438 can include displaying the determined internal state variable(s) using a graphical user interface (GUI), such as a heads-up display in a vehicle associated with the battery, for instance. Additionally or alternatively, various determined internal state variables can be added to a database (e.g., in memory 226, previously discussed in connection with FIG. 2).

Method 438 can include fault detection, such as the identification of one or more cells associated with the battery that exceed a particular threshold (e.g., a low state of health). Such identification can yield a corresponding notification to a user via the graphical user interface, for instance.

As another example, if battery state of charge is determined to exceed another threshold (e.g., the charge capacity of the battery is not being used to a full extent), method 438 can include increasing a discharge of the battery and/or altering (e.g., decreasing) a fossil fuel consumption of an HEV to optimize an HEV powertrain, for instance.

Additionally, determined internal state variables can be used in battery charging applications. For example, if during a charging of a battery the battery temperature exceeds a particular threshold (e.g., particular temperature level and/or particular temperature level over a period of time), a rate of charge associated with the battery can be reduced. Accordingly, the charging rate can be increased responsive to the temperature falling below a particular threshold. As another example, accelerated battery charging and/or discharging can be achieved by controlling internal heat release based on an available cooling capacity (e.g., to match available cooling capacity).

Although not illustrated in FIG. 4, in some embodiments, method 438 can return to block 440, and blocks 440 and 442 can be repeated for a number of additional internal state variable determinations.

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in example embodiments illustrated in the figures for the purpose of streamlining the disclosure. This method of disclosure is not to be interpreted as reflecting an intention that the embodiments of the disclosure require more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A method for monitoring a battery of a vehicle, comprising:
   receiving, at a computing device, a plurality of values from a plurality of sensors associated with a battery of a vehicle, each value associated with a respective battery characteristic;
   determining an internal state associated with the battery based, at least in part, on the plurality of values and a plurality of parameterized passive non-linear components of an equivalent circuit model of the battery, wherein the circuit includes a plurality of parallel sub-circuits, and wherein determining the internal state associated with the battery includes determining:
      a remaining charge associated with the battery;
      a state of health associated with the battery;
      a remaining energy associated with the battery; and
      an actual peak power associated with the battery; and
   displaying the determined internal state using a graphical user interface of the vehicle.

2. The method of claim 1, wherein the battery is a lithium-ion battery.

3. The method of claim 1, wherein the plurality of battery characteristics include:
   a voltage associated with the battery;
   a current associated with the battery; and
   a temperature associated with the battery.

4. The method of claim 1, wherein the equivalent circuit model of the battery includes:
   a plurality of capacitors;
   a plurality of current sources;
   a first plurality of resistors; and
   a second plurality of resistors.

5. The method of claim 1, wherein the method includes parameterizing the passive non-linear components using a plurality of static functions including:

$$R_i = R_{i0}(1 + \alpha_{RSOC}(1 - q_i/q_{MAX}) + \alpha_{RSOH}(1 - SOH) - \alpha_{RT}(T - T_0));$$

$$R_p = R_{p0};$$

$$u_{Ci} = U_0 - \frac{K_1}{K_2 + \bar{q}_i} + A\exp(B\bar{q}_i), \bar{q}_i = q_i(1 + \alpha_{USOH}(1 - SOH));$$

and $$i_{Di} = k_{dif}(q_{i+1} - q_i).$$

6. The method of claim 5, wherein the method includes determining the internal state associated with the battery using a plurality of model dynamics including:

$$\dot{q}_i = i_{Ci};$$

$$\dot{SOH} = -\alpha_{SOHi}(1 + \alpha_{SOHT}(T - T_0))|i|;$$

$$\dot{Q} = \frac{1}{T_Q}(Q_R - Q); \text{ and}$$

$$\dot{T} = \frac{1}{T_{COOL}}(T_{AMB} - T) + \frac{1}{C_T}Q$$

wherein $q_i$ is a charge in a capacitor i of the circuit, $SOH\epsilon<0,1>$ is a state of health associated with the equivalent circuit model of the battery, $Q_R$ is a total heat released from the battery represented by the circuit, $Q$ is delayed heat released from the battery represented by the circuit, and $T$ is a temperature associated with the battery represented by the circuit.

7. The method of claim 6, wherein the method includes testing the equivalent circuit model of the battery to determine a plurality of parameters associated with the battery, and wherein the plurality of parameters includes:
   $R_{i0}, \alpha_{RSOC}, q_{MAX}, \alpha_{RSOH}, \alpha_{RT}, T_0, R_{p0}, U_0, K_1, K_2, A, B, \alpha_{USOH}, k_{dif}$ 8. The method of claim 1, wherein the battery includes a plurality of cells, and wherein determining the state comprises determining the state irrespective of variability between individual parameters of the plurality of cells.

9. A system for monitoring a battery, comprising:
   a lithium-ion battery associated with a vehicle;
   at least one sensor associated with the battery; and
   a controller having logic to:
      receive a plurality of values, each value determined by the at least one sensor and associated with a respective characteristic of the battery;
      determine a plurality of internal state variables associated with the battery based, at least in part, on the plurality of values and a plurality of parameterized passive non-linear components of an equivalent circuit model of the battery, wherein the circuit includes a plurality of parallel sub-circuits, and wherein determining the plurality of internal state variables associated with the battery includes determining:
         a remaining charge associated with the battery;
         a state of health associated with the battery;
         a remaining energy associated with the battery; and
         an actual peak power associated with the battery; and
      display the determined plurality of internal state variables using a graphical user interface of the vehicle responsive to the determination of the plurality of internal state variables associated with the battery.

10. The system of claim 9, the controller having logic to display the determined plurality of internal state variables using a graphical user interface of the vehicle associated with the battery responsive to the determination of the plurality of internal state variables associated with the battery.

11. The system of claim 9, the controller having logic to store the determined internal state in a memory of a computing device responsive to the determination of the plurality of internal state variables associated with the battery.

12. The system of claim 9, the controller having logic to provide a fault notification to a user responsive to the determination of the plurality of internal state variables associated with the battery.

13. A non-transitory computer-readable medium having instructions stored thereon executable by a processor to:

determine an initial internal state associated with a battery, wherein determining the initial internal state associated with the battery includes determining:
  an initial remaining charge associated with the battery;
  an initial state of health associated with the battery;
  an initial remaining energy associated with the battery; and
  an initial actual peak power associated with the battery;
display the determined initial internal state using a graphical user interface;
receive a plurality of values from at least one sensor associated with the battery, each value associated with a respective characteristic of the battery; and
determine an updated internal state associated with the battery based on:
  the received plurality of values;
  a measurement model; and
  a description of an uncertainty associated with a plurality of constant parameters, wherein determining the updated internal state associated with the battery includes determining:
    an updated remaining charge associated with the battery;
    an updated state of health associated with the battery;
    an updated remaining energy associated with the battery; and
    an updated actual peak power associated with the battery; and
predict a next internal state associated with the battery based on:
  the description of the uncertainty associated with the plurality of constant parameters; and
  a dynamic model, wherein predicting the next internal state associated with the battery includes predicting:
    a next remaining charge associated with the battery;
    a next state of health associated with the battery;
    a next remaining energy associated with the battery; and
    a next actual peak power associated with the battery.

14. The computer-readable medium of claim 13, wherein the instructions include instructions executable to determine initial internal state responsive to an activation of the vehicle associated with the battery.

15. The computer-readable medium of claim 13, wherein the instructions include instructions executable to determine the initial internal state associated with the battery by:

$$x_0 \sim N(\hat{x}_0, P_{x_0}), P_{\theta x_0} = 0.$$

16. The computer-readable medium of claim 13, wherein the instructions include instructions executable to determine the updated internal state associated with the battery by:

$$x_k \sim N(\hat{x}_k, P_{x_k}).$$

17. The computer-readable medium of claim 13, wherein the instructions include instructions executable to predict the next internal state associated with the battery by:

$$x_{k+1} \sim N(\hat{x}_{k+1}, P_{x_{k+1}}).$$

* * * * *